(12) United States Patent
Yoshizawa

(10) Patent No.: US 9,285,271 B2
(45) Date of Patent: Mar. 15, 2016

(54) SLOPED STRUCTURE, METHOD FOR MANUFACTURING SLOPED STRUCTURE, AND SPECTRUM SENSOR

(71) Applicant: SEIKO EPSON CORPORATION, Tokyo (JP)

(72) Inventor: Takahiko Yoshizawa, Sakata (JP)

(73) Assignee: SEIKO EPSON CORPORATION, Tokyo (JP)

(*) Notice: Subject to any disclaimer, the term of this patent is extended or adjusted under 35 U.S.C. 154(b) by 39 days.

(21) Appl. No.: 14/313,122

(22) Filed: Jun. 24, 2014

(65) Prior Publication Data

US 2014/0299955 A1    Oct. 9, 2014

Related U.S. Application Data

(62) Division of application No. 13/572,192, filed on Aug. 10, 2012, now Pat. No. 8,889,463.

(30) Foreign Application Priority Data

Aug. 19, 2011  (JP) .................................. 2011-179646

(51) Int. Cl.
*H01L 31/0352* (2006.01)
*G01J 3/02* (2006.01)
*H01L 29/06* (2006.01)
(Continued)

(52) U.S. Cl.
CPC .............. *G01J 3/0256* (2013.01); *G01J 1/0488* (2013.01); *G01J 3/36* (2013.01); *G02B 5/201* (2013.01); *G02B 5/285* (2013.01); *H01L 29/06* (2013.01); *H01L 31/02165* (2013.01); *H01L 31/02327* (2013.01); *H01L 31/02366* (2013.01); *H01L 31/18* (2013.01); *B81B 2201/047* (2013.01); *B81B 2203/0384* (2013.01); *G01J 2003/1213* (2013.01)

(58) Field of Classification Search
CPC . H01L 21/3105; H01L 29/06; H01L 29/0692; H01L 31/0352; B81B 2203/03894; B81B 2203/0384; G01J 1/0488
See application file for complete search history.

(56) References Cited

U.S. PATENT DOCUMENTS 7,057,251 B2 *  6/2006  Reid .................... B81B 3/0078
                                                              257/432
7,511,750 B2     3/2009  Murakami
(Continued)

FOREIGN PATENT DOCUMENTS

CN          1054319 A       9/1991
CN        200947125 Y       9/2007
(Continued)

*Primary Examiner* — Mohsen Ahmadi
*Assistant Examiner* — Stephen Bradley
(74) *Attorney, Agent, or Firm* — Oliff PLC

(57) ABSTRACT

A method for manufacturing a sloped structure is disclosed. The method includes the steps of: (a) forming a sacrificial film above a substrate; (b) forming a first film above the sacrificial film, the first film having a first portion connected to the substrate, a second portion located above the sacrificial film, a third portion located between the first portion and the second portion, and a thin region in a portion of the third portion or in a boundary section between the second portion and the third portion and having a thickness smaller than the first portion; (c) removing the sacrificial film; and (d) bending the first film in the thin region, after the step (c), thereby sloping the second portion of the first film with respect to the substrate.

17 Claims, 12 Drawing Sheets

(51) Int. Cl.
  *G01J 3/36* (2006.01)
  *G01J 1/04* (2006.01)
  *G02B 5/20* (2006.01)
  *G02B 5/28* (2006.01)
  *H01L 31/0216* (2014.01)
  *H01L 31/0232* (2014.01)
  *H01L 31/0236* (2006.01)
  *H01L 31/18* (2006.01)
  *G01J 3/12* (2006.01)

(56) References Cited

U.S. PATENT DOCUMENTS

| | | | |
|---|---|---|---|
| 7,728,395 B2 | 6/2010 | Yang et al. | |
| 7,850,441 B2 | 12/2010 | Usa et al. | |
| 8,889,463 B2 * | 11/2014 | Yoshizawa | H01L 29/06 257/432 |
| 2008/0142680 A1 | 6/2008 | Usa et al. | |
| 2009/0133804 A1 | 5/2009 | Kanematsu et al. | |
| 2011/0013179 A1 | 1/2011 | Meijer et al. | |
| 2011/0215432 A1 | 9/2011 | Uematsu et al. | |
| 2011/0215434 A1 | 9/2011 | Briceno | |
| 2011/0216315 A1 | 9/2011 | Uematsu et al. | |
| 2011/0233388 A1 | 9/2011 | Nakamura | |
| 2011/0233703 A1 | 9/2011 | Nakamura | |
| 2011/0244190 A1 | 10/2011 | Yoshizawa | |
| 2012/0208130 A1 | 8/2012 | Yoshizawa | |
| 2012/0235269 A1 | 9/2012 | Uematsu et al. | |
| 2012/0236297 A1 | 9/2012 | Uematsu et al. | |
| 2012/0236313 A1 | 9/2012 | Nakamura | |
| 2013/0026590 A1 | 1/2013 | Yoshizawa | |

FOREIGN PATENT DOCUMENTS

| | | |
|---|---|---|
| CN | 101983357 A | 3/2011 |
| JP | A-6-129908 | 5/1994 |
| JP | A-2005-331651 | 12/2005 |
| JP | A-2007-98930 | 4/2007 |
| JP | A-2007-226075 | 9/2007 |
| JP | A-2007-287929 | 11/2007 |
| JP | A-2008-142895 | 6/2008 |
| JP | 2009-258511 A | 11/2009 |
| JP | A-2011-185364 | 9/2011 |
| JP | A-2011-203247 | 10/2011 |
| JP | A-2011-205088 | 10/2011 |
| JP | A-2011-209395 | 10/2011 |
| JP | A-2011-210807 | 10/2011 |
| JP | A-2011-218453 | 11/2011 |
| JP | A-2012-189515 | 10/2012 |
| JP | A-2012-189931 | 10/2012 |

* cited by examiner

SLOPED STRUCTURE, METHOD FOR MANUFACTURING SLOPED STRUCTURE, AND SPECTRUM SENSOR

This is a Division of application Ser. No. 13/572,192 filed Aug. 10, 2012, which claims priority to Japanese Patent Application No. 2011-179646, filed Aug. 19, 2011. The disclosures of the prior applications are hereby incorporated by reference herein in their entirety.

BACKGROUND

1. Technical Field

The present invention generally relates to micro sloped structures, methods for manufacturing a sloped structure, and spectrum sensors using the sloped structure.

2. Related Art

Spectrum sensors are used in the medical, agricultural and environmental fields for diagnosing and examining objects. For example, in the medical field, a pulse oximeter is used to measure the oxygen saturation of blood, using light absorption of hemoglobin. Also, in the agricultural field, a saccharometer is used to measure the concentration of sugar content of fruits, using light absorption of sugar.

Japanese Laid-open Patent Application HEI 6-129908 (related art) describes a spectroscopic imaging sensor that restricts incident angles of light with an optical fiber that optically connects interference filters and photovoltaic converter elements, thereby restricting the transmission wavelength bandwidth of light to the photovoltaic converter elements. However, size-reduction of such a spectrum sensor by the related art is difficult.

For example, for manufacturing a small-size spectrum sensor, micro sloped structures need to be formed. However, it has been difficult to manufacture such micro structures according to the related art.

SUMMARY

The invention has been made in view of the technical difficulty described above. In accordance with some aspects of the invention, a micro sloped structure, a method for manufacturing a micro sloped structure, and a spectrum sensor using the sloped structure are provided.

In accordance with an embodiment of the invention, a method for manufacturing a sloped structure includes the steps of: (a) forming a sacrificial film above a substrate; (b) forming a first film above the sacrificial film, the first film having a first portion connected to the substrate, a second portion located above the sacrificial film, a third portion located between the first portion and the second portion, and a thin region in a portion of the third portion or in a boundary section between the second portion and the third portion and having a thickness smaller than the first portion; (c) removing the sacrificial film; and, after the step (c), (d) bending the first film in the thin region thereby sloping the second portion of the first film with respect to the substrate. According to the aspect described above, a micro sloped structure can be readily manufactured with a process having high affinity to a semiconductor device fabrication process.

In the embodiment described above, the manufacturing method may preferably further include the step (e), between the step (a) and the step (b), of patterning the sacrificial film to expose a side surface of the sacrificial film on which the third portion of the first film is formed. According to this aspect, by forming and then patterning the sacrificial film, a sloped structure can be formed at any specified location on the substrate.

In the embodiment described above, the step (b) may preferably include forming an overhang at the boundary section between the second portion and the third portion while depositing the first film, thereby forming the thin region in an area among the third portion below the overhang. According to this aspect, the thin section can be formed in fewer steps.

In the embodiment described above, the sacrificial film formed by the step (a) may preferably include a first layer and a second layer located above the first layer, and the step (e) may preferably include exposing the side surface of the sacrificial film by using etching liquid or etching gas that causes an etching rate of the first layer greater than an etching rate of the second layer. According to this aspect, the overhang and the thin section can be more readily formed.

In the embodiment described above, the step (b) may preferably include forming the first film by a plasma CVD method, thereby forming the thin region in the boundary section between the second portion and the third portion. According to this aspect, the thin section can be formed in fewer steps.

In the embodiment described above, the step (d) may preferably include supplying liquid between the first film and the substrate, and then removing the liquid. According to this aspect, the first film can be bent and the second portion of the first film can be sloped with respect to the substrate, without having to apply an excessive force to the first film.

In the embodiment described above, the manufacturing method may preferably further include the step (f), after the step (d), of filling material for a second film between the first film and the substrate. According to this aspect, by forming the second film, the optical characteristic of the sloped structure can be adjusted.

In the embodiment described above, the manufacturing method may preferably further include the step (g), after the step (f), of removing the first film. According to this aspect, as the first film is removed, the degree of freedom in selecting material for the first film can be improved.

In accordance with another embodiment of the invention, a sloped structure includes: a first portion connected to a first surface of a substrate, a second portion sloped with respect to the first surface of the substrate, and a third portion connecting the first portion and the second portion together, and having a thin region having a thickness smaller than the first portion or the second portion. According to this aspect, a useful optical device using a micro sloped structure can be manufactured.

In accordance with still another embodiment of the invention, a spectrum sensor includes an angle restriction filter that restricts an incident direction of passing light, a multilayered film that restricts wavelength of transmitting light or reflecting light according to the incident direction, any one of the sloped structures described above that specifies an inclination angle between the incident direction of light passing through the angle restriction filter and a lamination direction of the multilayered film, and a photodiode that detects light passing through the angle restriction filter and transmitted through or reflected at the multilayered film. According to the embodiment described above, by implementing the sloped structure, a small-size spectrum sensor can be manufactured. It is noted that the term "above" used in the description means a direction opposite to the direction toward the back surface of the substrate with the top surface of the substrate as reference.

DESCRIPTION OF EXEMPLARY EMBODIMENTS

Embodiments of the invention are described in detail below. It is noted that the embodiments described below do not unduly limit the contents of the invention set forth in the scope of patent claims. Also, not all of the compositions described in the embodiments would necessarily be essential for the solution provided by the invention. Furthermore, the same components will be appended with the same reference numbers, and their description will not be repeated.

1. First Embodiment

FIGS. 1-3 are cross-sectional views showing a method for manufacturing a sloped structure in accordance with a first embodiment of the invention. The manufacturing method in accordance with the present embodiment uses the semiconductor processing technology, thereby providing a low-cost manufacturing method that can readily achieve device miniaturization.

1-1. Film Formation of First Film

Figure 1A:
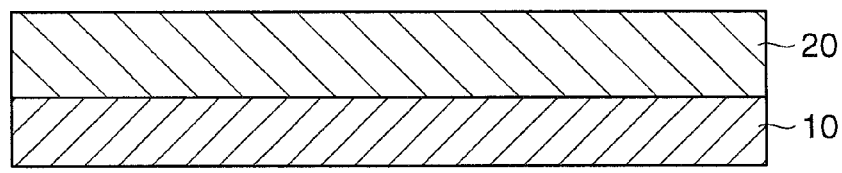
FIGS. 1A and 1C-1E are cross-sectional views showing a method for manufacturing a sloped structure in accordance with a first embodiment of the invention.

First, as shown in FIG. 1A, a sacrificial film 20 is formed on a substrate 10. The substrate 10 may be, for example, a silicon oxide ($SiO_2$) substrate, or a silicon oxide substrate with an angle restriction filter (to be described below) formed thereon. As the sacrificial film 20, for example, a silicon nitride (SiN) film may be used.

Figure 1C:
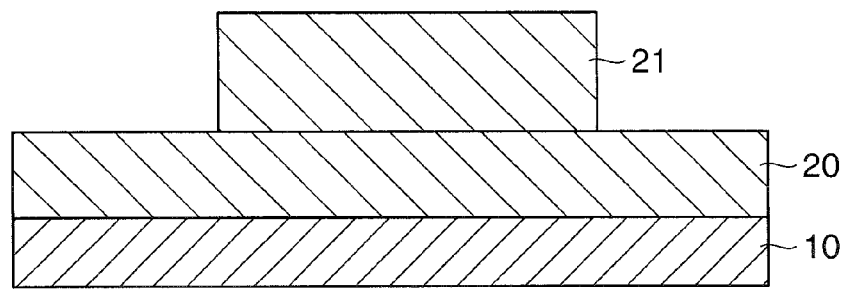
Figure 1D:
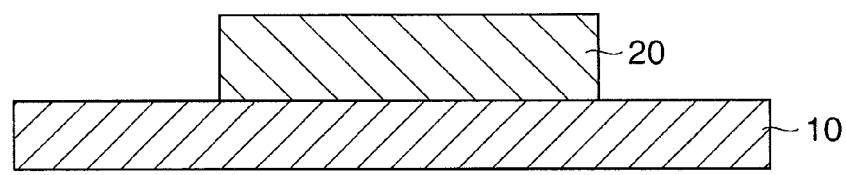

Next, as shown in FIG. 1C, a resist film 21 is formed on the sacrificial film 20, and the resist film 21 is patterned into a predetermined shape (for example, a rectangular shape), by exposure and development of the resist film 21. Then, as shown in FIG. 1D, the sacrificial film 20 is etched, using the resist film 21 as an etching mask. By this step, the sacrificial film 20 is patterned into the same shape as the predetermined shape (for example, a rectangular shape). Thereafter, the resist film 21 is removed.

1-2. Film Formation of First Film

Figure 1E:
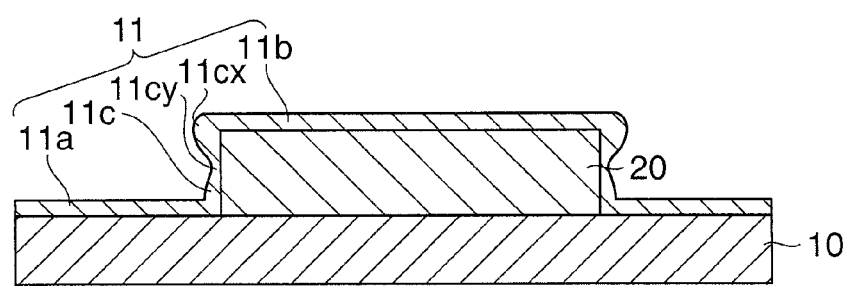

Next, as shown in FIG. 1E, a first film 11 that serves as a film for composing a sloped structure is formed in a manner to cover the top surface of the substrate 10 exposed in the step shown in FIG. 1D, and the top surface of the sacrificial film 20 and the side surface of the sacrificial film 20 exposed in the step shown in FIG. 1D. The first film 11 may be formed by, for example, a physical vapor deposition (PVD) method including a sputter method, a vacuum deposition method, or the like, or a chemical vapor deposition (CVD) method. As the first film 11, for example, a silicon oxide film may be used. The first film 11 includes a first portion 11a extending along the top surface of the substrate 10, a second portion 11b extending along the top surface of the sacrificial film 20, and a third portion 11c extending along the side surface of the sacrificial film 20.

In this instance, a thicker region (an overhang 11cx), which is thicker than other portions of the first film 11, is formed in the first film 11 at a boundary section between the second portion 11b and the third portion 11c. The overhang 11cx is formed because the material composing the first film 11 tends to more readily deposit at the boundary section between the second portion 11b and the third portion 11c. Methods for reducing overhangs have been developed. For example, by adjusting the composing material and the film forming condition for the first film 11, the overhang may be reduced. In contrast, however, the present embodiment positively utilizes overhangs. The overhang 11cx has a shape that protrudes in a direction in parallel with the top surface of the sacrificial film 20, such that the material composing the first film 11 is difficult to be deposited in an area below the overhang 11cx (on the side of the substrate 10). Accordingly, a thin region 11cy having a film thickness smaller than that of other areas is formed in the area below the overhang 11cx. In the first film 11, the film thickness of the thin region 11cy having a smaller thickness may preferably be, for example, 0.8 times or less the film thickness of the overhang 11cx having a greater thickness.

Figure 2F:
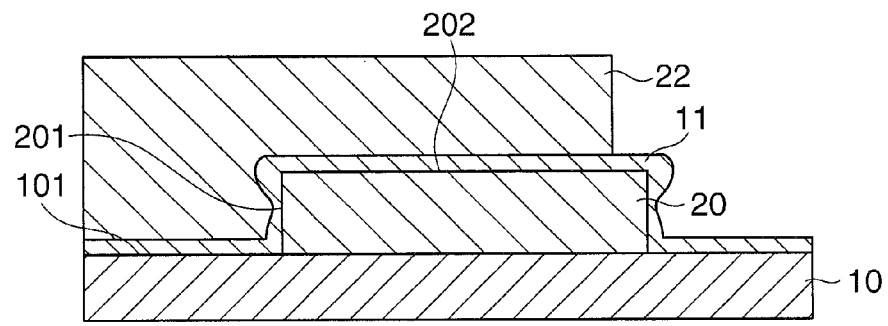
FIGS. 2F-2I are cross-sectional views showing the method for manufacturing a sloped structure in accordance with the first embodiment of the invention.

Next, as shown in FIG. 2F, a resist film 22 is formed on the first film 11, and the resist film 22 is patterned into a predetermined shape by exposure and development. In this instance, the resist film 22 is patterned into a shape that covers one side surface 201 of the sacrificial film 20, a partial region 202 of the top surface of the sacrificial film 20 that connects to the side surface, and a partial region 101 of the top surface of the substrate 10.

Figure 2G:
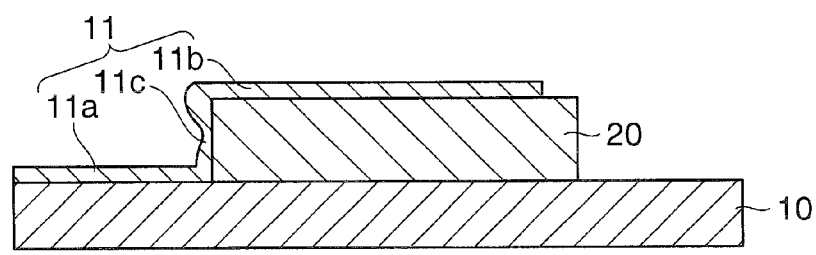

Next, as shown in FIG. 2G, the first film 11 is etched, using the resist film 22 as an etching mask. As a result, the first film 11 is removed, while leaving a first portion 11a that connects to the substrate 10, a second portion 11b that connects to the top surface of the sacrificial film 20, and a third portion 11c extending along the one side surface of the sacrificial film 20. Thereafter, the resist film 22 is removed.

Figure 2H:
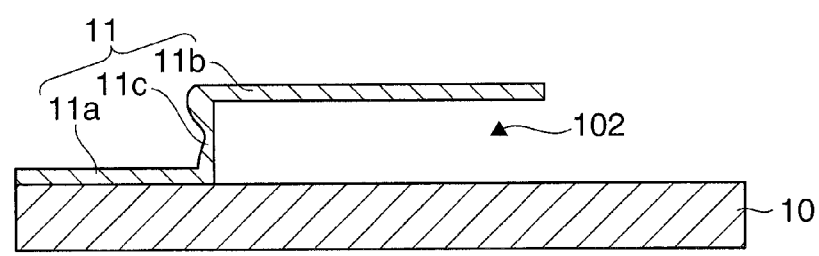

Next, as shown in FIG. 2H, the sacrificial film 20 is removed by, for example, wet etching. When the sacrificial film 20 is, for example, a silicon nitride film, phosphoric acid ($H_3PO_4$) may be used as the etching liquid for removing the sacrificial film 20.

By removing the sacrificial film 20, a space 102 is formed between the substrate 10 and the first film 11. The first portion 11a of the first film 11 connects to the substrate 10, and the second portion 11b of the first film 11 is located separated from the substrate 10. The third portion 11c of the first film 11 is located between the first portion 11a and the second portion 11b and supports the second portion 11b.

1-3. Formation of Slope

Figure 2I:
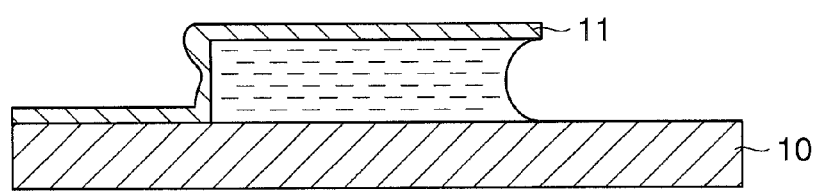

Next, as shown in FIG. 2I, liquid is supplied in the space between the substrate 10 and the first film 11. For example, the substrate 10 and the first film 11 may be submerged in liquid having large surface tension (for example, water) stored in a container (not shown), and thereafter removed from the container.

Figure 3J:
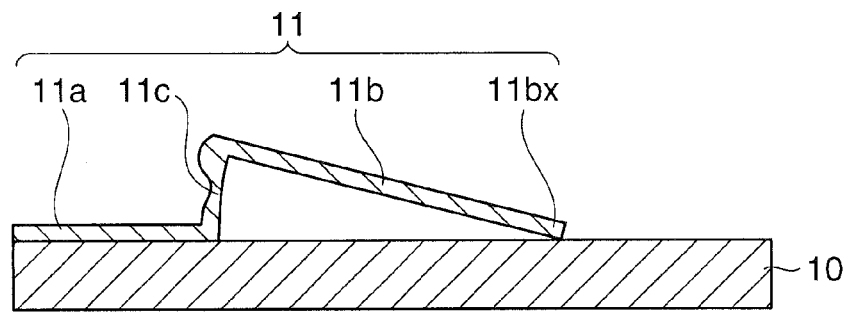
FIGS. 3J-3M are cross-sectional views showing the method for manufacturing a sloped structure in accordance with the first embodiment of the invention.

Next, as shown in FIG. 3J, the liquid supplied in the space between the substrate 10 and the first film 11 is evaporated. In this instance, the liquid supplied in the space between the substrate 10 and the first film 11 pulls an end portion 11bx of the second portion 11b of the first film 11 toward the substrate 10 by its surface tension. As the liquid supplied in the space between the substrate 10 and the first film 11 evaporates, the liquid in the space reduces. By this, the thin region 11cy having a smaller thickness located in the third portion 11c of the first film 11 is bent, thereby tilting the second portion 11b of the first film 11. The thin region 11cy having a smaller thickness in the first film 11 may be folded. The second portion 11b may preferably be sloped until the end portion 11bx of the second portion 11b of the first film 11 comes in contact with the substrate 10. More preferably, the end portion 11bx of the second portion 11b and the substrate 10 may adhere to each other by sticking. The "sticking" is a phenomenon in which a substrate and a structure or structures surrounding liquid adhere to each other by the meniscus force generated by the surface tension that works when the liquid evaporates. By the steps described above, a first sloped structure including the first film 11 is formed.

Figure 3K:
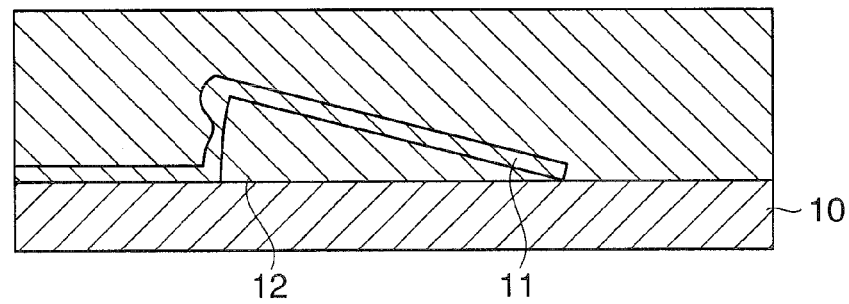

Further, as shown in FIG. 3K, liquid material for a second film 12 is filled between the first film 11 and the substrate 10, if necessary. Thereafter, the liquid material is solidified by means of heating or the like. As the liquid material for forming the second film 12, for example, SOG (spin on glass) may be used.

Figure 3L:
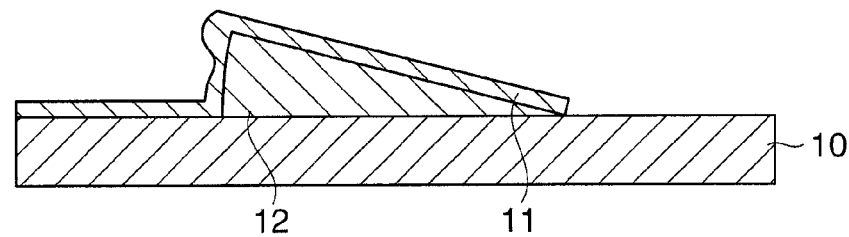

Next, as shown in FIG. 3L, among the solidified liquid material, portions on the first film 11 are removed by anisotropic etching. By the steps described above, a second sloped structure including the first film 11 and the second film 12 is formed.

Figure 3M:
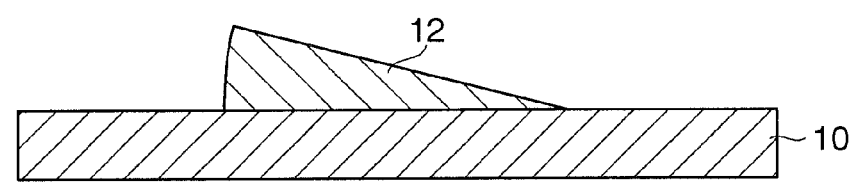

Further, as shown in FIG. 3M, the first film 11 may be removed by etching, if necessary. By removing the first film 11, a third sloped structure including only the second film 12 is formed.

In the steps described above, the substrate 10 is formed from silicon oxide, the sacrificial film 20 is formed from silicon nitride, the first film 11 is formed from silicon oxide, and the etching liquid for removing the sacrificial film 20 is phosphoric acid. However, the invention is not limited to the above, and the following combinations are possible.

For example, the substrate 10 may be formed from silicon oxide, the sacrificial film 20 may be formed from aluminum, the first film 11 may be formed from silicon oxide, and the etching liquid for removing the sacrificial film 20 may be aqueous ammonia/hydrogen peroxide mixture ($NH_4OH+H_2O_2+H_2O$) or mixed solution of phosphoric acid, nitric acid and acetic acid ($H_3PO_4+NHO_3+CH_3COOH$).

Also, for example, the substrate 10 may be formed from silicon oxide, the sacrificial film 20 may be formed from resist material, the first film 11 may be formed from silicon oxide, and the sacrificial film 20 may be removed by dry ashing with $O_2$ plasma.

1-4. Effect of Embodiments

According to the manufacturing process described above, by using film formation, exposure, development, etching techniques, and the like which have high affinity to a semiconductor device fabrication process, sloped structures can be manufactured. Accordingly, the invention makes it easier to mix and mount sloped structures and semiconductor circuits on a single chip.

Also, the slope angle of the sloped structure can be finely adjusted by the length of the second portion 11b of the first film 11, and the length of the third portion 11c of the first film 11 (the thickness of the sacrificial film 20). Also, the thin region 11cy having a smaller thickness can be formed in the third portion 11c in fewer steps.

Further, it is not necessary to make metal molds, which are expensive and quickly worn down, for manufacturing sloped structures, and it is not necessary to remake metal molds for changing the shape of the sloped structures. Moreover, according to the manufacturing process described above, micro sloped structures can be manufactured not only with materials (for example, resin) that can be formed by metal molds, but also with any one of other various materials.

2. Second Embodiment

FIGS. 4-6 are cross-sectional views showing a method for manufacturing a sloped structure in accordance with a second embodiment of the invention. The manufacturing method in accordance with the second embodiment pertains to a method by which the overhang in the first film 11 can be more readily formed.

Steps shown in FIGS. 4-6 are generally the same in many aspects as those shown in FIGS. 1-3. However, they are different from the process shown in FIGS. 1-3 in that a sacrificial film 20 includes a first layer 20a and a second layer 20b.

Figure 4A:
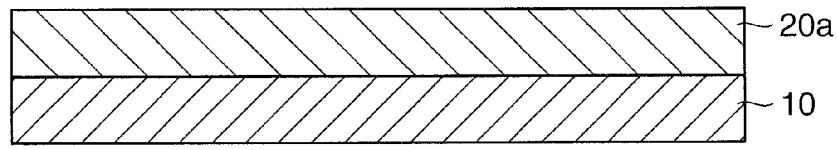
FIGS. 4A-4E are cross-sectional views showing a method for manufacturing a sloped structure in accordance with a second embodiment of the invention.
Figure 4B:
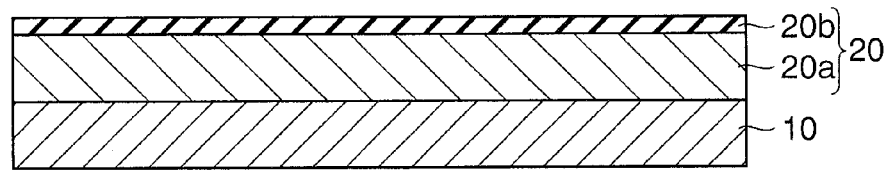

First, as shown in FIG. 4A, a first layer 20a composing a sacrificial film 20 is formed on a substrate 10 that may be formed from, for example, silicon oxide or the like. Then, as shown in FIG. 4B, a second layer 20b composing the sacrificial film 20 is formed on the first layer 20a. The first layer 20a and the second layer 20b are formed from mutually different materials. For example, the first layer 20a may be formed from aluminum, and the second layer 20b may be formed from titanium nitride (TiN).

Figure 4C:
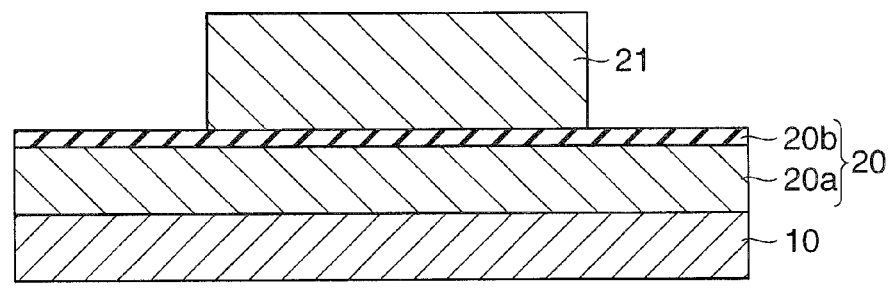

In a manner similar to the step described with reference to FIG. 1C, a resist film 21 is formed on the sacrificial film 20, and the resist film 21 is patterned into a predetermined shape (for example, a rectangular shape) by exposure and development, as shown in FIG. 4C.

Figure 4D:
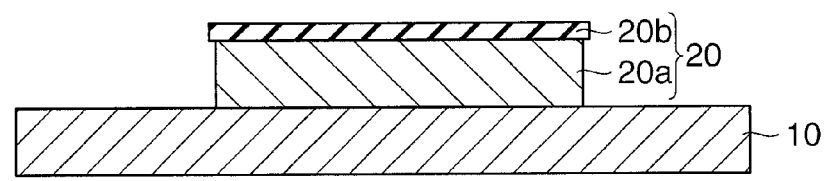

Then, in a manner similar to the step described with reference to FIG. 1D, the sacrificial film 20 is etched, as shown in FIG. 4D, using the resist film 21 as an etching mask. In this instance, the etching is conducted with etching gas that causes the etching rate of the first layer 20a of the sacrificial film 20 to be greater than the etching rate of the second layer 20b. For example, when the first layer 20a is formed from aluminum, and the second layer 20b is formed from titanium nitride, dry etching may be conducted with chlorine group gas ($Cl_2$, $BCl_3$, etc.). By this etching, the sacrificial film 20 is patterned into a shape generally identical with the predetermined shape of the resist film 21 (for example, a rectangular shape), but the first layer 20a is etched more than the second layer 20b. As a result, the second layer 20b forms a shape in which its side surface protrudes in a direction in parallel with the top surface of the sacrificial film 20 from the side surface of the first layer 20a. The second layer 20b may preferably be located above the center of the film thickness of the sacrificial film 20.

Figure 4E:
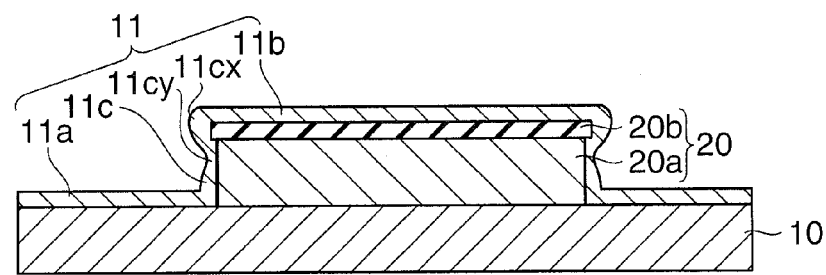
Figure 5F:
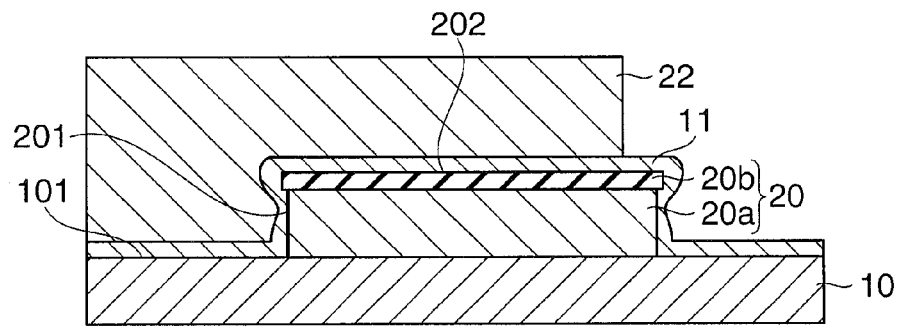
FIGS. 5F-5I are cross-sectional views showing the method for manufacturing a sloped structure in accordance with the second embodiment of the invention.
Figure 5G:
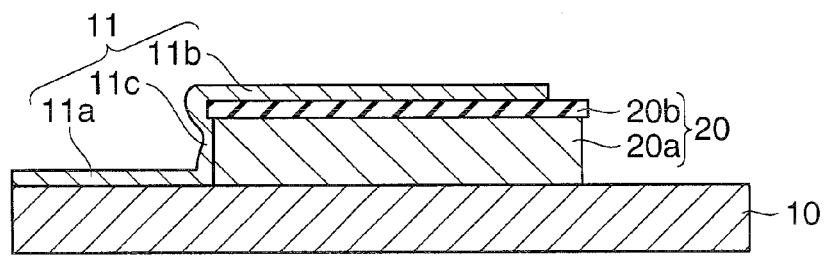
Figure 5H:
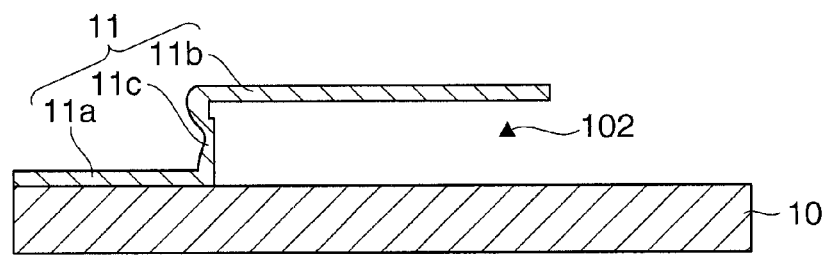
Figure 5I:
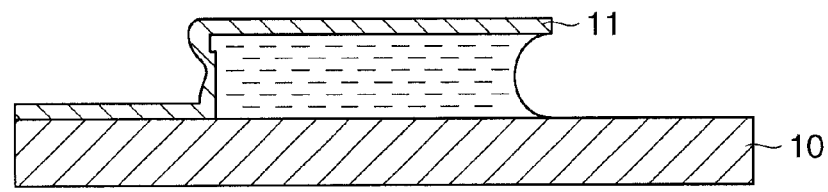
Figure 6J:
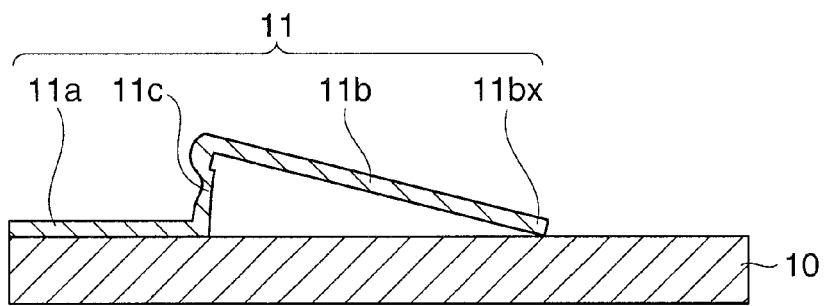
FIGS. 6J-6M are cross-sectional views showing the method for manufacturing a sloped structure in accordance with the second embodiment of the invention.
Figure 6K:
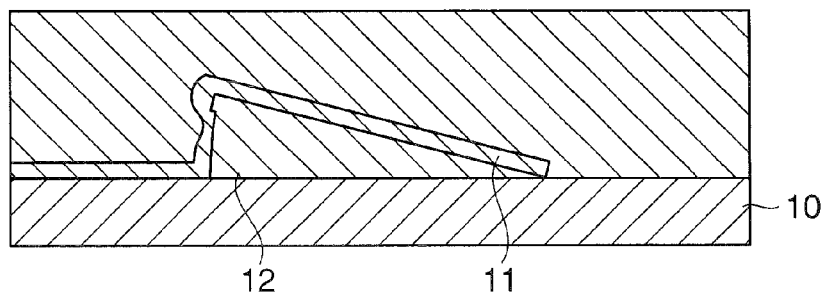
Figure 6L:
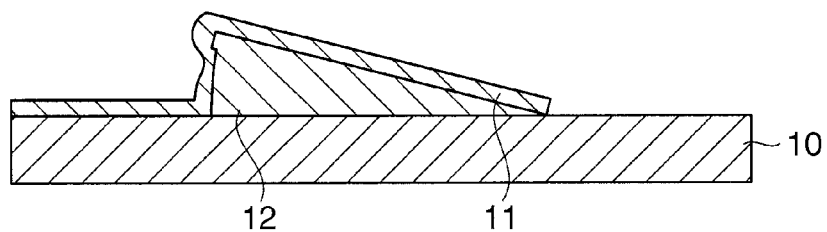
Figure 6M:
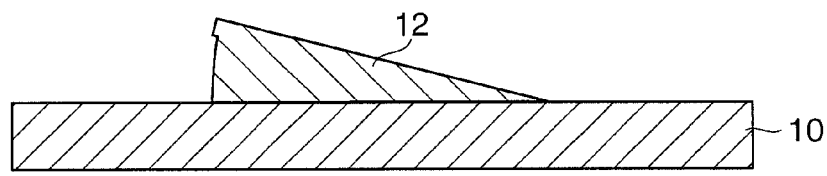

Next, in a manner similar to the step described with reference to FIG. 1E, a first film 11 that serves as a film for composing a sloped structure is formed in a manner to cover the top surface of the substrate 10, the top surface of the sacrificial film 20 and the side surface of the sacrificial film 20, as shown in FIG. 4E. The first film 11 may be formed by, for example, a physical vapor deposition (PVD) method, such as, a sputter method, a vacuum deposition method, or the like, or a chemical vapor deposition (CVD) method. As the first film 11, for example, a silicon oxide film may be used. The first film 11 includes a first portion 11a extending along the top surface of the substrate 10, a second portion 11b extending along the top surface of the sacrificial film 20, and a third portion 11c extending along the side surface of the sacrificial film 20.

In this instance, a thicker region (an overhang 11cx), which is thicker than other portions of the first film 11, is formed in the first film 11 at a boundary section between the second portion 11b and the third portion 11c. In this embodiment, the first layer 20a of the sacrificial film 20 is etched more than the second layer 20b, such that the overhang 11cx is more readily formed. Further, a thin region 11cy having a film thickness smaller than other regions is formed in the region below the overhang 11cx.

Thereafter, in a manner similar to the steps described with reference to FIGS. 2 and 3, the first film 11 is etched, the sacrificial film 20 is removed, and the second portion 11b of the first film 11 is sloped, whereby a sloped structure is formed, as shown in FIGS. 5 and 6.

3. Third Embodiment

FIGS. 7-8 are cross-sectional views showing in part a method for manufacturing a sloped structure in accordance with a third embodiment of the invention. The manufacturing method in accordance with the third embodiment pertains to a method by which the overhang in the first film 11 can be more readily formed.

Steps shown in FIGS. 7 and 8 are generally the same in many aspects as those shown in FIGS. 4 and 5. However, as shown in FIG. 7A and FIG. 7B, the process in accordance with the third embodiment is different from the process shown in FIGS. 4 and 5 in that a second layer 20c of a sacrificial film 20 is formed by surface property modification of the sacrificial film 20.

Figure 7A:
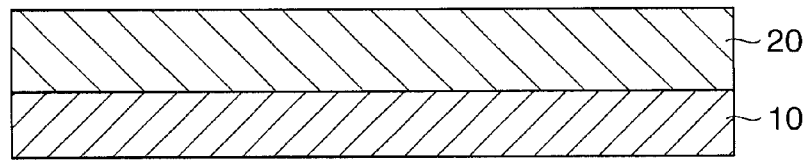
FIGS. 7A-7E are cross-sectional views showing a method for manufacturing a sloped structure in accordance with a third embodiment of the invention.
Figure 7B:
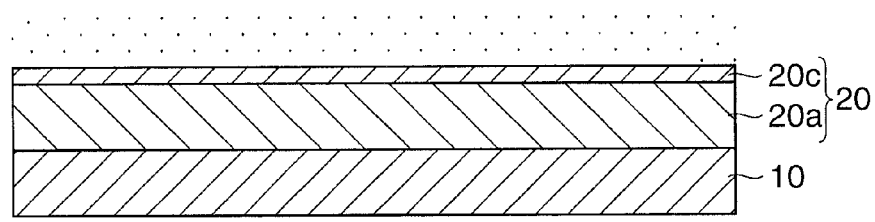
Figure 7C:
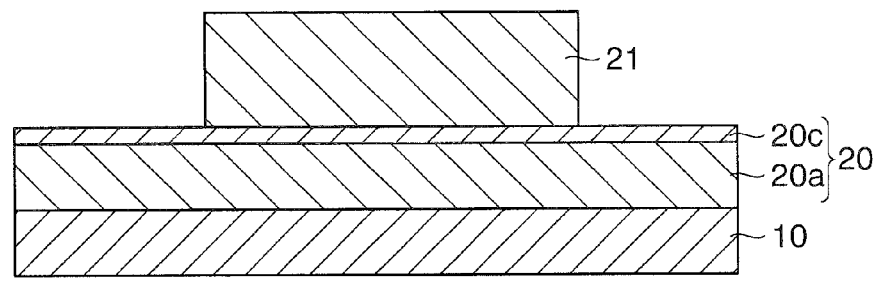
Figure 7D:
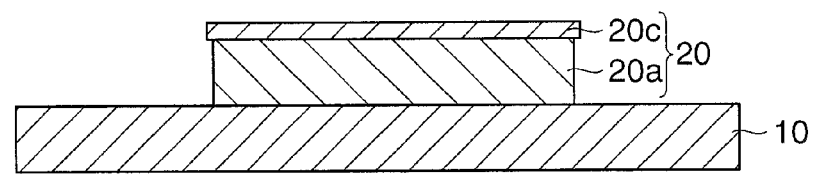
Figure 7E:
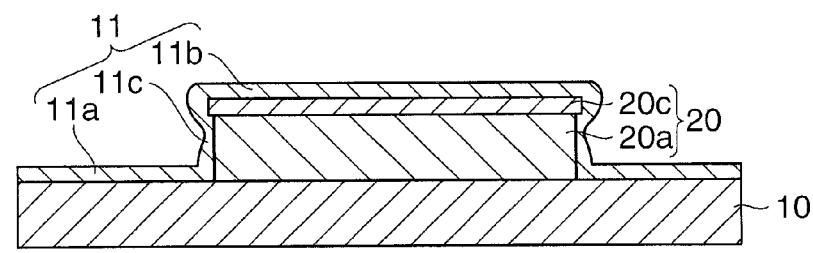
Figure 8F:
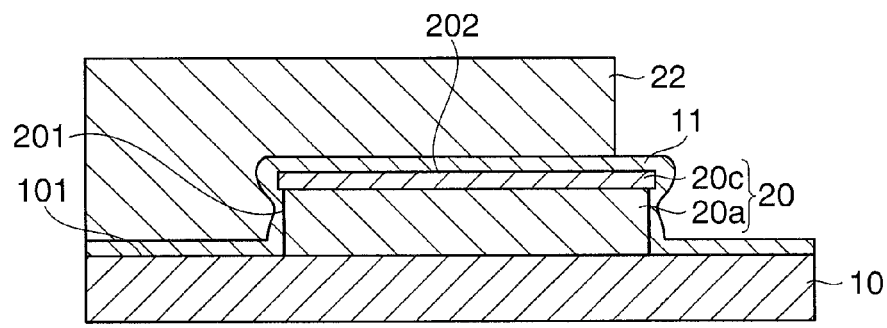
FIGS. 8F-8I are cross-sectional views showing the method for manufacturing a sloped structure in accordance with the third embodiment of the invention.
Figure 8G:
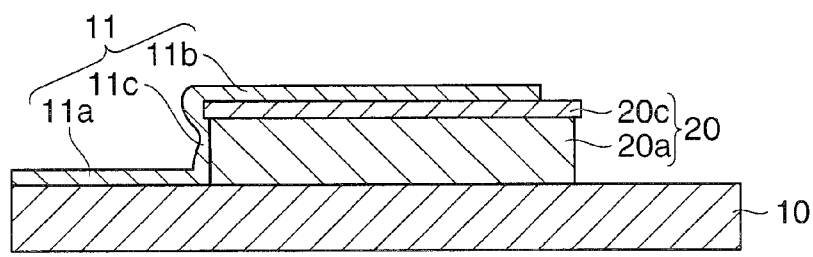
Figure 8H:
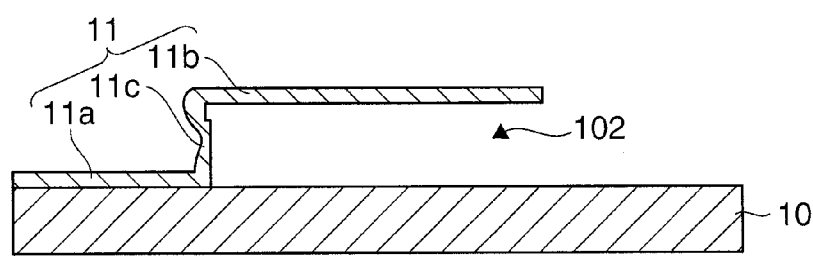
Figure 8I:
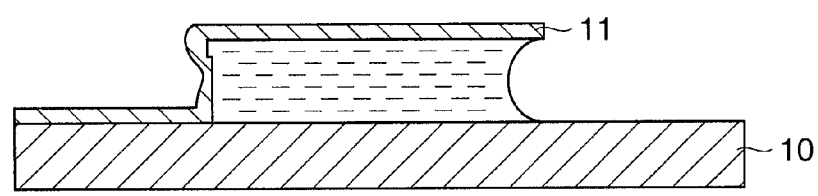
Figure 9A:
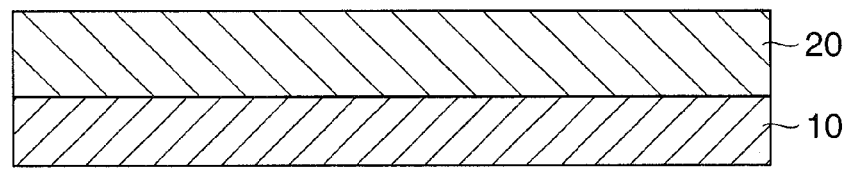
FIGS. 9A and 9C-9E are cross-sectional views showing a method for manufacturing a sloped structure in accordance with a fourth embodiment of the invention.
Figure 9C:
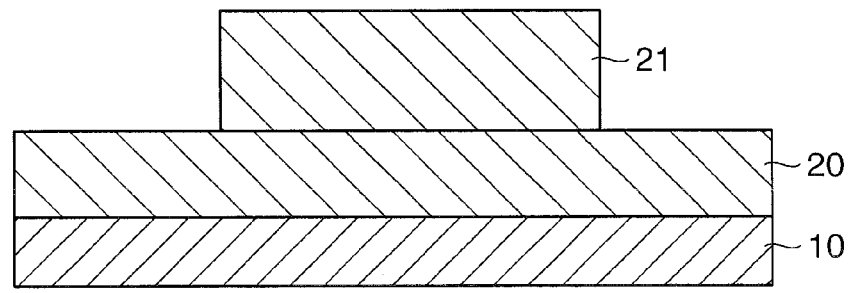
Figure 9D:
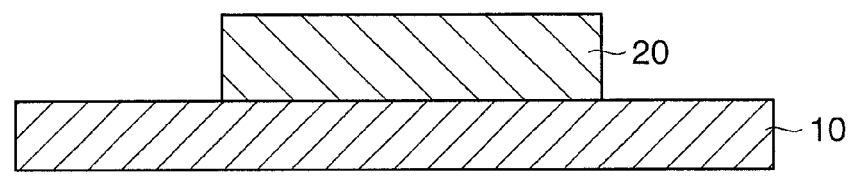
Figure 9E:
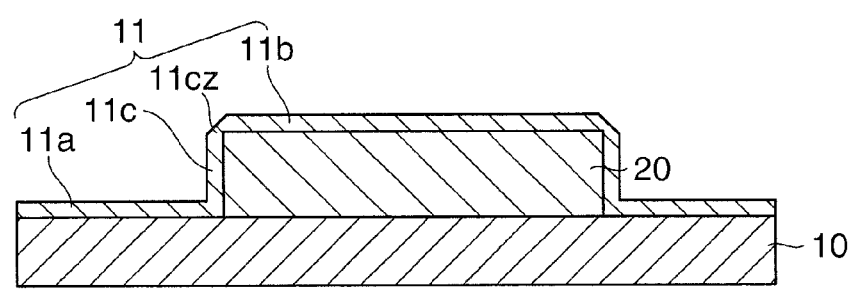
Figure 10F:
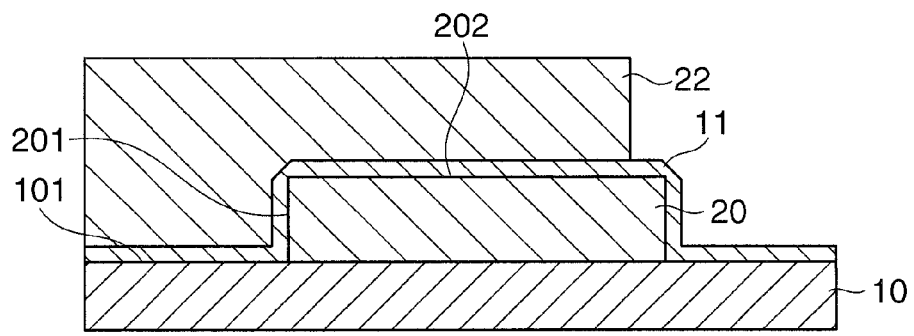
FIGS. 10F-10I are cross-sectional views showing the method for manufacturing a sloped structure in accordance with the fourth embodiment of the invention.
Figure 10G:
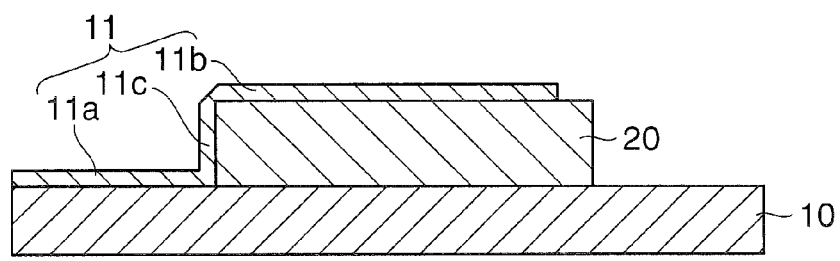
Figure 10H:
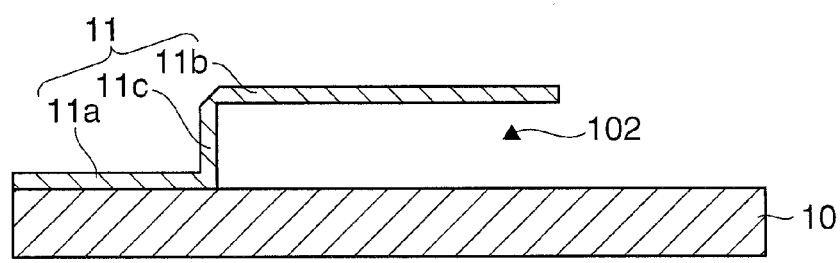
Figure 10I:
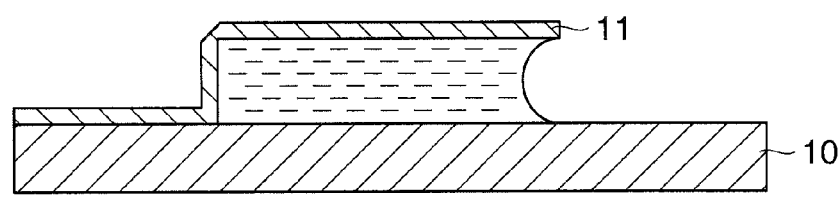
Figure 11J:
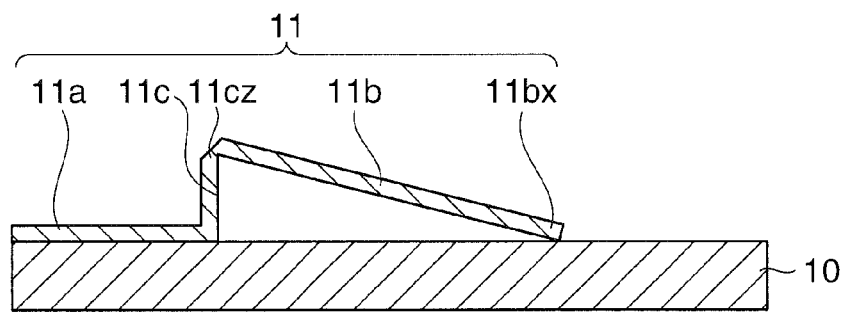
FIGS. 11J-11M are cross-sectional views showing the method for manufacturing a sloped structure in accordance with the fourth embodiment of the invention.
Figure 11K:
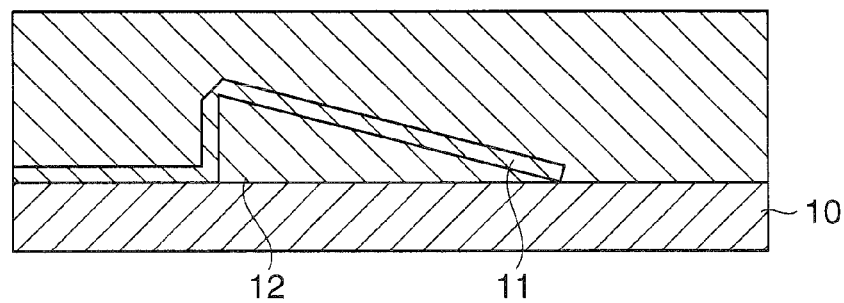
Figure 11L:
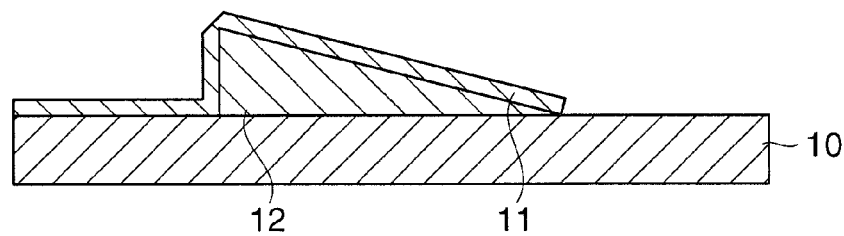
Figure 11M:
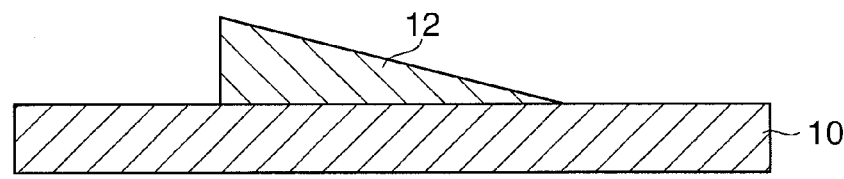

First, as shown in FIG. 7A, a sacrificial film 20 of silicon (Si) or the like is formed on a substrate 10 of silicon oxide or the like. Then, as shown in FIG. 7B, ions are injected in the sacrificial film 20, thereby conducting surface property modification of the sacrificial film 20. By this step, a second layer 20c is formed on the top surface side of the sacrificial film 20. A remaining portion of the sacrificial film 20 excluding the second layer 20c serves as a first layer 20a.

Steps succeeding the above-described steps are generally the same as the steps shown in FIGS. 4-6. In the etching of the sacrificial film 20 shown in FIG. 7D, the etching is conducted with etching solution that causes the etching rate of the first layer 20a of the sacrificial film 20 to be greater than the etching rate of the second layer 20c. For example, when the first layer 20a is formed from silicon, and the second layer 20c is formed from silicon injected with ions, for example, tetramethyl ammonium hydroxide (TMAH), ethylene diamine pyrocatecol (EDP), or potassium hydroxide (KOH) may be used. By this etching, the sacrificial film 20 is patterned into a shape generally identical with the predetermined shape of the resist film 21, but the first layer 20a is etched more than the second layer 20c. As a result, the second layer 20c forms a shape in which its side surface protrudes from the side surface of the first layer 20a in a direction in parallel with the top surface of the sacrificial film 20. The second layer 20c may preferably be located above the center of the film thickness of the sacrificial film 20.

Thereafter, in a manner similar to the steps shown in FIGS. 4-6, a first film 11 is formed in a manner to form an overhang, the first film 11 is etched, the sacrificial film 20 is removed, and a second portion 11b of the first film 11 is sloped, whereby a sloped structure can be formed.

4. Fourth Embodiment

FIGS. 9-11 are cross-sectional views showing a method for manufacturing a sloped structure in accordance with a fourth embodiment of the invention. The manufacturing method in accordance with the fourth embodiment pertains to a method for manufacturing a sloped structure through forming a thin region having a smaller thickness in a boundary section between the second portion 11b and the third portion 11c of the first film 11.

Steps shown in FIGS. 9-11 are generally the same in many aspects as those shown in FIGS. 1-3. However, the process in accordance with the fourth embodiment is different from the process shown in FIGS. 1-3 in that a first film 11 is formed by a plasma CVD method. More specifically, in the step shown in FIG. 9E, a first film 11 that serves as a film composing a sloped structure is formed in a manner to cover the top surface of a substrate 10, the top surface of a sacrificial film 20 and the side surface of the sacrificial film 20. The first film 11 is formed by a plasma CVD method, such as, for example, a high density plasma (HDP) CVD method or the like. As the first film 11, for example, a silicon oxide film may be used. The first film 11 includes a first portion 11a extending along the top surface of the substrate 10, a second portion 11b extending along the top surface of the sacrificial film 20, and a third portion 11c extending along the side surface of the sacrificial film 20.

According to the plasma CVD method, the first film 11 is formed while being etched by plasma. For this reason, a tapered portion 11cz is formed at a boundary section between the second portion 11b and the third portion 11c in the first film 11. The tapered portion 11cz forms a thin area having a thickness smaller than other areas in the first film 11.

Thereafter, as shown in FIGS. 10 and 11, the first film 11 is etched, the sacrificial film 20 is removed, and the second portion 11b of the first film 11 is sloped, in a manner similar to the steps described with reference to FIGS. 2 and 3. As shown in FIG. 11J, when the second portion 11b of the first film 11 is sloped, the tapered portion 11c z having a smaller film thickness is bent or folded. By the steps described above, a sloped structure can be formed.

5. Transmission Type Spectrum Sensor

Figure 12:
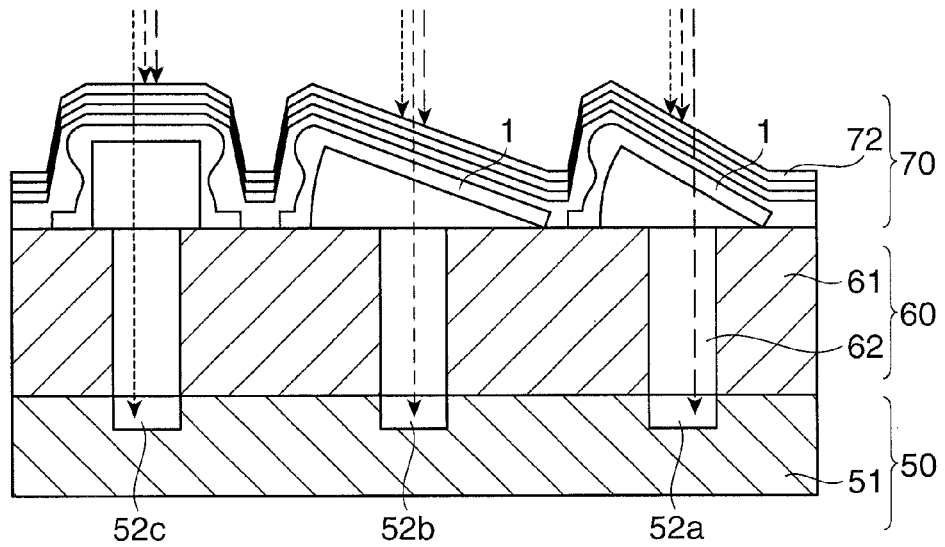
FIG. 12 is a cross-sectional view of a first example of a spectrum sensor in accordance with an embodiment of the invention.

FIG. 12 is a cross-sectional view of a first example of a spectrum sensor using the sloped structure in accordance with an embodiment of the invention. The spectrum sensor shown in FIG. 12 includes an optical device section 50 having photodiodes, an angle restriction filter section 60, and a spectrum filter section 70.

The optical device section 50 is equipped with a substrate 51 formed from semiconductor material such as silicon, and photodiodes 52a, 52b and 52c formed in the substrate 10. Further, the substrate 51 includes an electronic circuit (not shown) formed thereon to perform various operations, such as, applying a predetermined reverse bias voltage to the photodiodes 52a, 52b and 52c, detecting a current based on photoelectric power generated at the photodiodes 52a, 52b and 52c, amplifying analog signals according to the magnitude of the current, and converting the analog signals to digital signals.

5-1. Angle Restriction Filter Section

The angle restriction filter section 60 is formed above the substrate 51. The angle restriction filter section 60 includes a shield section 61 that forms optical path walls, and optical paths are formed by transmissive material 62 such as silicon oxide or the like surrounded by the optical path walls. The shield section 61 is formed from material that does not substantially transmit light having wavelengths that are to be received by the photodiodes 52a, 52b and 52c. The shield section 61 may be formed with a plurality of layers, for example, in a predetermined lattice pattern, sequentially deposited on the substrate 51, whereby the optical paths are formed in a direction perpendicular to the surface of the substrate 51.

The incident angle of light passing through the optical paths is restricted by the angle restriction filter section 60. More specifically, when light entered the optical paths is inclined more than a predetermined restriction angle with respect to the direction of the optical paths, the light hits the shield section 61, a portion of the light is absorbed by the shield section 61, and the remaining portion is reflected. The reflection is repeated and the reflected light becomes weaker while the light is passing through the optical paths. Accordingly, light that can pass the angle restriction filter section 60 is substantially limited to light that enters the optical paths at inclinations less than the predetermined restriction angle with respect to the optical paths.

5-2. Spectrum Filter Section

The spectrum filter section 70 includes sloped structures 1 formed on the angle restriction filter section 60, and a multilayer film 72 formed on the sloped structures 1. The multilayer film 72 is formed from thin films of a low refractive index material such as silicon oxide and thin films of a high refractive index material such as titanium oxide, laminated in multiple layers, and slightly inclined with respect to the substrate 51. The thin films of a low refractive index and the thin films of a high refractive index each have a predetermined film thickness, for example, on the order of submicron, and are laminated, for example, in about 60 layers in total, such that the entire multilayer film 72 is, for example, about 6 µm in thickness.

The angle of inclination of the multilayer film 72 with respect to the substrate 51 may be set, for example, at 0 degree or greater but at 30 degrees or smaller, according to set wavelengths of light to be received by the photodiodes 52a, 52b and 52c. In order to have the multilayer film 72 inclined with respect to the substrate 51, the sloped structures 1 having light transmissivity are formed on the angle restriction filter section 60, and the multilayer film 72 is formed on the sloped structures 1. As the sloped structures 1, sloped structures fabricated by the manufacturing method described above may be used.

According to the structure described above, a portion of incident light that has entered the spectrum filter section 70 becomes reflected light and another portion thereof becomes transmitting light at an interface between a set of the low refractive index thin film and the high refractive index thin film. Then, a portion of the reflected light reflects again at an interface between another set of the low refractive index thin film and the high refractive index thin film, and couples with the aforementioned transmitting light. In this instance, when light has a wavelength that matches with the optical path length of reflected light, the reflected light and the transmitting light match in phase with each other, and thus strengthen each other. When light has a wavelength that does not match with the optical path length of reflected light, the reflected light and the transmitting light do not match in phase with each other, and thus weaken each other (destructively interfere with each other).

Here, the optical path length of reflected light is determined by the angle of inclination of the multilayer film 72 with respect to the direction of the incident light. Accordingly, when the interference action described above is repeated in the multilayer film 72, which is formed from as many as 60 layers in total, light having only specific wavelengths can pass through the spectrum filter section 70, according to the incident angle of incident light, and is emitted from the spectrum filter section 70 at a predetermined emission angle (for example, at the same angle as the incident angle to the spectrum filter section 70).

The angle restriction filter section 60 allows only light incident on the angle restriction filter section 60 in the predetermined range of restriction angles to pass therein. Accordingly, the wavelengths of light that passes through the spectrum filter section 70 and the angle restriction filter section 60 are restricted to a predetermined range of wavelengths, which is determined by the lamination direction of the multilayer film 72, and the incident direction of incident light allowed by the angle restriction filter section 60 to pass.

By forming in advance the sloped structures 1 having angles of inclination that differ depending on the set wavelengths of light to be received by the photodiodes 52a, 52b and 52c, the multilayer film 72 can be formed in the same film thickness by a common process, regardless of the set wavelengths of light to be received by the photodiodes 52a, 52b and 52c.

5-3. Optical Device Section

The photodiodes 52a, 52b and 52c included in the optical device section 50 receive light that has passed through the spectrum filter section 70 and the angle restriction filter section 60, and generate photovoltaic power. The photodiodes 52a, 52b and 52c include impurity regions formed by ion injection or the like in the substrate 51 that is composed of semiconductor material.

As light that has passed through the spectrum filter section 70 and the angle restriction filter section 60 is received by the photodiodes 52a, 52b and 52c, photovoltaic power is generated, whereby an electric current is generated. By detecting the electric current by an electronic circuit (not shown), the light is detected.

5-4. Method for Manufacturing Spectrum Sensor

Here, a method for manufacturing the spectrum sensor in the first example is briefly described. The spectrum sensor is manufactured through initially forming the photodiodes 52a, 52b and 52c on the substrate 51, then forming the angle restriction filter section 60 on the photodiodes 52a, 52b and 52c, and then forming the spectrum filter section 70 on the angle restriction filter section 60.

According to the present embodiment, spectrum sensors can be manufactured in one continuous operation by the semiconductor process, and spectrum sensors using the sloped structures having any desired angles of inclination can be readily formed. Also, by using multiple sloped structures having different angles of inclination, light with multiple wavelengths can be detected.

6. Reflection Type Spectrum Sensor

Figure 13:
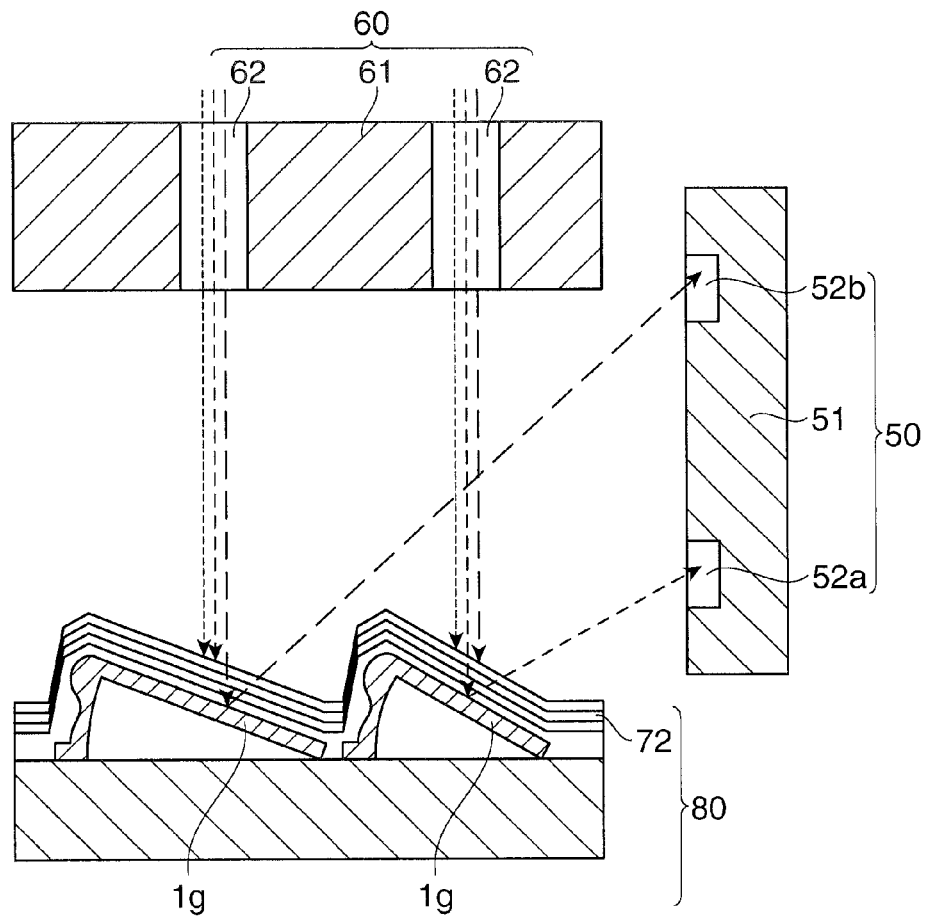
FIG. 13 is a cross-sectional view of a second example of a spectrum sensor in accordance with an embodiment of the invention.

FIG. 13 is a cross-sectional view of a second example of a spectrum sensor using the sloped structure in accordance with any one of the embodiments of the invention. The spectrum sensor shown in FIG. 13 includes an optical device section 50 having photodiodes, an angle restriction filter section 60, and a spectrum filter section 80.

The angle restriction filter section 60 is formed above the spectrum filter section 80. The angle restriction filter section 60 may be formed separated from the spectrum filter section 80, or may be formed in contact with the spectrum filter section 80.

The spectrum filter section 80 includes sloped structures 1g having a high reflection coefficient and a multilayer film 72 formed on the sloped structures 1g. As the sloped structures 1g, sloped structures manufactured by the manufacturing method described above may be used.

According to the structure described above, the spectrum filter section 80 restricts wavelengths of reflecting light according to incident direction of light passing through the angle restriction filter section 60. More specifically, among incident light passed through the angle restriction filter section 60 and entered the spectrum filter section 80, only light having a specified wavelength is reflected by the spectrum filter section 80, according to the incident angle, and is emitted from the spectrum filter section 80 at a predetermined emission angle (for example, at the same angle as the incident angle to the spectrum filter section 80).

By forming in advance the sloped structures 1g having angles of inclination that differ depending on the set wavelengths of light to be received by the photodiodes 52a and 52b, the multilayer film 72 can be formed in the same film thickness by a common process, regardless of the set wavelengths of light to be received by the photodiodes 52a and 52b.

The photodiodes 52a and 52b included in the optical device section 50 receive light that has passed through the angle restriction filter section 60 and reflected by the spectrum filter section 80, and generate photovoltaic power.

As the device that uses the sloped structures, an optical sensor is described above. However, the sloped structure may be used as any one of other types of devices. For example, the sloped structure may be used as an optical device, such as, a prism, a mirror or the like for relaying light signals with a predetermined wavelength in a relay device for optical fibers.

What is claimed is:

1. A sloped structure comprising:
   a first portion connected to a first surface of a substrate;
   a second portion sloped with respect to the first surface of the substrate; and
   a third portion connecting the first portion and the second portion together, and having a thin region thinner than the first portion or the second portion,
   wherein an end portion of the second portion is adhered to the substrate, the end portion being at an end of the second portion opposite to a third portion side of the second portion.

2. The sloped structure according to claim 1, the sloped structure further comprising:
   an overhang formed at a boundary section between the second portion and the third portion.

3. The sloped structure according to claim 2, wherein the thin region is formed between the overhang and the first portion.

4. The sloped structure according to claim 2, wherein the thin region has a thickness of 0.8 times or less than a thickness of the overhang.

5. The sloped structure according to claim 1, wherein the sloped structure is formed of silicon oxide.

6. The sloped structure according to claim 1, the sloped structure further comprising:
   a fourth portion formed between the second portion and the substrate, the fourth portion being sloped with respect to the first surface of the substrate.

7. The sloped structure according to claim 6, wherein the fourth portion is formed of a liquid material.

8. The sloped structure according to claim 7, wherein the liquid material is spin on glass.

9. The sloped structure according to claim 1, the sloped structure further comprising:
   a recessed portion formed between the thin region and the second portion.

10. The sloped structure according to claim 1, the sloped structure further comprising:
    a tapered portion formed at a boundary section between the second portion and the third portion, the tapered portion forming the thin region.

11. A spectrum sensor comprising:
    an angle restriction filter that restricts an incident direction of passing light;
    a multilayered film that restricts wavelength of transmitting light or reflecting light according to the incident direction;
    the sloped structure recited in claim 1, specifying an inclination angle between the incident direction of light passing through the angle restriction filter and a lamination direction of the multilayered film; and
    a photodiode that detects light passing through the angle restriction filter and transmitted through or reflected at the multilayered film.

12. The spectrum sensor according to claim 11, wherein the sloped structure is light reflective.

13. The spectrum sensor according to claim 11, wherein the sloped structure is light transmissive.

14. The spectrum sensor according to claim 11, wherein the sloped structure is arranged between the multilayer film and the substrate.

15. A spectrum sensor comprising:
    a plurality of angle restriction filters that restrict an incident direction of passing light;

a plurality of multilayered films that restrict wavelength of transmitting light or reflecting light according to the incident direction;

a plurality of the sloped structures recited in claim 1, the sloped structures specifying an inclination angle between the incident direction of light passing through each of the angle restriction filters and a lamination direction of each of the multilayered films; and a plurality of photodiodes that detect light passing through each of the angle restriction filters and transmitted through or reflected at each of the multilayered films.

16. The spectrum sensor according to claim 15, wherein the sloped structures are light reflective.

17. The spectrum sensor according to claim 15, wherein the sloped structures are light transmissive.

* * * * *